(12) United States Patent
Choi

(10) Patent No.: US 7,655,873 B2
(45) Date of Patent: Feb. 2, 2010

(54) ELECTROMAGNETIC SHIELDING FILM, PLASMA DISPLAY PANEL FILTER USING THE ELECTROMAGNETIC SHIELDING FILM, PLASMA DISPLAY PANEL DEVICE INCLUDING THE ELECTROMAGNETIC SHIELDING FILM, AND METHOD OF MANUFACTURING THE ELECTROMAGNETIC SHIELDING FILM

(75) Inventor: Yong-won Choi, Seoul (KR)

(73) Assignee: Samsung Corning Co., Ltd., Gyeonggi-do (KR)

( * ) Notice: Subject to any disclaimer, the term of this patent is extended or adjusted under 35 U.S.C. 154(b) by 553 days.

(21) Appl. No.: 11/213,082

(22) Filed: Aug. 26, 2005

(65) Prior Publication Data

US 2006/0043895 A1     Mar. 2, 2006

(30) Foreign Application Priority Data

Sep. 1, 2004     (KR) ...................... 10-2004-0069593

(51) Int. Cl.
*H05K 9/00*     (2006.01)

(52) U.S. Cl. .................. 174/350; 174/377; 313/489; 313/587

(58) Field of Classification Search ......... 313/582–587, 313/489, 580; 174/350, 377
See application file for complete search history.

(56) References Cited

U.S. PATENT DOCUMENTS 6,448,492 B1 *   9/2002   Okada et al. ................ 174/389
7,304,250 B2 *  12/2007   Arakawa et al. ............ 174/381
7,343,673 B2 *   3/2008   Kim et al. ..................... 29/825
7,371,450 B2 *   5/2008   Arakawa et al. ............ 428/138
2002/0153149 A1 * 10/2002  Okada et al. ............... 174/35 R (Continued)

FOREIGN PATENT DOCUMENTS

JP          11-119675 A       4/1999

(Continued)

OTHER PUBLICATIONS

Japanese Office Action issued in Japanese Patent Application No. JP 2005-252959, mailed May 9, 2008.

*Primary Examiner*—Bumsuk Won
(74) *Attorney, Agent, or Firm*—McDermott Will & Emery LLP

(57) ABSTRACT

Provided are an electromagnetic shielding film capable of improving brightness, a plasma display panel (PDP) filter using the electromagnetic shielding film, a PDP device including the electromagnetic shielding film, and a method of manufacturing the electromagnetic shielding film. The electromagnetic shielding film includes a transparent substrate, an electromagnetic shielding film pattern which is formed on the transparent substrate and whose face opposite to the transparent substrate is blackened, and a black conductive layer pattern which is formed on the electromagnetic shielding film pattern. The method includes (a) forming a non-conductive layer on a conductive substrate, (b) forming a non-conductive layer pattern by patterning the non-conductive layer, (c) forming a black conductive layer pattern on the conductive substrate exposed by the non-conductive layer pattern, (d) forming an electromagnetic shielding film pattern on the black conductive layer pattern, (e) oxidizing the electromagnetic shielding film pattern to blacken the same, and (f) separating the black conductive layer pattern and the electromagnetic shielding film pattern from the conductive substrate using a transparent substrate on a face of which an adhesive is formed.

7 Claims, 6 Drawing Sheets

U.S. PATENT DOCUMENTS

| | | | |
|---|---|---|---|
| 2004/0159554 A1* | 8/2004 | Okumura et al. | 205/128 |
| 2004/0214023 A1* | 10/2004 | Park et al. | 428/458 |
| 2004/0222003 A1* | 11/2004 | Kim et al. | 174/35 R |
| 2006/0027383 A1* | 2/2006 | Kim et al. | 174/35 MS |

FOREIGN PATENT DOCUMENTS

| | | |
|---|---|---|
| JP | 11-266095 | 9/1999 |
| JP | 2000-077887 | 11/1999 |
| JP | 2002-009484 | 1/2002 |
| JP | 2003-198181 | 7/2003 |
| WO | WO 2004-016060 | 2/2004 |

\* cited by examiner

ELECTROMAGNETIC SHIELDING FILM, PLASMA DISPLAY PANEL FILTER USING THE ELECTROMAGNETIC SHIELDING FILM, PLASMA DISPLAY PANEL DEVICE INCLUDING THE ELECTROMAGNETIC SHIELDING FILM, AND METHOD OF MANUFACTURING THE ELECTROMAGNETIC SHIELDING FILM

This application claims priority from Korean Patent Application No. 10-2004-0069593 filed on Sep. 1, 2004, in the Korean Intellectual Property Office, the disclosure of which is incorporated herein in its entirety by reference.

BACKGROUND OF THE INVENTION

1. Field of the Invention

The present invention relates to an electromagnetic shielding film, a plasma display panel (PDP) filter using the electromagnetic shielding film, a PDP device including the electromagnetic shielding film, and a method of manufacturing the electromagnetic shielding film. More particularly, the present invention relates to an electromagnetic shielding film having a high refractive index in a visible light region, which can improve brightness and image quality by blackening not only a portion of the shielding film facing a user's side but also a portion opposite to the user's side, a method of manufacturing the electromagnetic shielding film, a PDP filter using the electromagnetic shielding film, and a PDP device including the electromagnetic shielding film.

2. Description of the Related Art

As modern society becomes more information-oriented, photoelectronic devices advancing and being more widely used. In particular, image display devices are widely used in a variety of applications, including TV screens, monitors of personal computers, etc. Wide screens and a thin build have become the mainstream technology for high performance image display devices.

Plasma display panels are gaining popularity as a next-generation display device to replace the CRT because of advantages in thinness, and that a big screen can be readily fabricated with a plurality of units. A PDP device includes a plasma display panel on which an image is displayed using a gas discharge phenomenon, and exhibits superior display capabilities, including high display capacity, high brightness, high contrast, clear latent image, and a wide viewing angle.

In a PDP device, when a direct current (DC) or alternating current (AC) voltage is applied to electrodes, a discharge of gas plasma is created, resulting in the emission of ultraviolet (UV) light. The UV emission excites adjacent phosphor materials, resulting in electromagnetic emission of visible light.

Despite the above advantages, PDPs have several problems associated with driving characteristics, including an increase in electromagnetic wave radiation, near-infrared emission, and phosphor surface reflection, and an obscured color purity due to orange light emitted from helium (He) or xenon (Xe) used as a sealing gas.

The electromagnetic wave and near-infrared ray generated in PDPs may adversely affect human bodies and cause malfunction of precision machines such as wireless telephones or remote controllers. Thus, in order to make use of such PDPs, there is a desire to reduce the electromagnetic wave and near-infrared rays emitted from the PDPs. In this respect, various PDP filters have been used for the purposes of, for example, shielding electromagnetic waves or near-infrared rays emitted from the PDPs, reducing reflection of light and/or enhancing color purity. Various PDP filters having an electromagnetic wave shielding function, a near-infrared rays shielding function, an antireflection function, and/or a color purity enhancing function, can be formed together with the PDPs.

A plasma display panel device includes a panel assembly that has a discharge cell in which gas discharge occurs and a PDP filter that shields electromagnetic waves and near-infrared rays.

The PDP filter, which is mounted on the entire surface of the panel assembly, should interfere as little as possible with transparency.

In a PDP device, an electric current flowing between a driving circuit and an alternating current (AC) electrode and a high voltage between electrodes used for plasma discharge are the main causes of electromagnetic waves. The electromagnetic waves generated by such causes are mainly in the frequency band of 30-200 MHz. Generally, a transparent conductive film or a conductive mesh that maintains a high visible light transmittance and a low refractive index in a visible light region is used as an electromagnetic shielding layer for shielding the generated electromagnetic waves.

An electromagnetic shielding layer made of a conductive mesh exhibits a superior electromagnetic shielding capability. An electromagnetic shielding layer made of a transparent conductive film such as an Indium Tin Oxide (ITO) film generally takes the form of a multi-layered thin film in which a metal thin film and a high refractive index transparent thin film are alternately coated. A main element of the metal thin film is silver (Ag) or an alloy of silver (Ag).

Hereinafter, a conventional method of manufacturing an electromagnetic shielding film including a conductive mesh will be described with reference to FIGS. 1A through 1C. FIGS. 1A through 1C are sectional views of sequential processing steps for explaining the conventional method of manufacturing an electromagnetic shielding film.

As shown in FIG. 1A, a metal thin film 30 is attached to a transparent substrate 10 using an adhesive 20 having appropriate adhesion strength through lamination. The transparent substrate 10 is generally a polyethylene terephthalate (PET) film. As shown in FIG. 1B, a photoresist pattern 40 is formed by coating a photoresist on the metal thin film 30 and patterning the photoresist using a photolithographic process (an exposure process and a development process). As shown in FIG. 1C, an electromagnetic shielding film pattern 32 is formed by etching the metal thin film 30 using the photoresist pattern 40 as an etching mask. After the photoresist pattern 40 used as the etching mask is removed, the electromagnetic shielding film pattern 32 on the transparent substrate 10 is blackened. The electromagnetic shielding film pattern 32 is generally made of a metal thin film having high electromagnetic shielding performance. However, when the electromagnetic shielding film pattern 32 is formed of a metal thin film, the inherent high refractive index of the metal thin film in the visible light region poses a problem. In particular, copper, which is widely used as the electromagnetic shielding film pattern 32, has a refractive index of 60% or more in the visible light region. Thus, when a PDP filter including the electromagnetic shielding film pattern 32 formed of copper is used on a PDP device, the brightness of the PDP device drops significantly. To reduce the refractive index of a metal, the electromagnetic shielding film pattern 32 is blackened. Referring to FIG. 1C, three faces of the conventional electromagnetic shielding film pattern 32, except for a face opposite to the transparent substrate 10, are blackened. In general, blackened portions of the electromagnetic shielding film pattern 32 face a user's (or viewer's) side of the PDP device. Thus, the refractive index of the PDP device in the visible light region is reduced from the viewpoint of the viewer.

However, since a portion of the electromagnetic shielding film pattern 32 facing the panel assembly's side is not blackened, the PDP device cannot obtain high brightness. In other words, light generated by the panel assembly of the PDP device is reflected from the electromagnetic shielding film pattern 32 and then enters the panel assembly, resulting in light superposition. As a result, the brightness of the PDP device drops, degrading image display capability.

Another conventional technique regarding a PDP filter having an electromagnetic shielding film pattern is disclosed in Japanese Patent Application No. Hei 11-119675 filed on Oct. 16, 1997, which is directed to a method of manufacturing an electromagnetic shielding plate. In the electromagnetic shielding plate, only a face opposite to the viewer's side is blackened. As a result, like the prior art shown in FIGS. 1A through 1C, light generated by a panel assembly is reflected from the electromagnetic shielding plate and then enters the panel assembly, resulting in degradation of the brightness and performance of a PDP device.

SUMMARY OF THE INVENTION

The present invention provides an electromagnetic shielding film that can enhance brightness by improving the structure of the electromagnetic shielding film.

The present invention also provides a plasma display panel (PDP) filter using the electromagnetic shielding film.

The present invention also provides a PDP device using the electromagnetic shielding film.

The present invention also provides a method of manufacturing the electromagnetic shielding film.

The above stated objects as well as other objects, features, and advantages of the present invention will become clear to those skilled in the art upon review of the following description.

According to an aspect of the present invention, there is provided an electromagnetic shielding film including a transparent substrate, an electromagnetic shielding film pattern which is formed above the transparent substrate, wherein a face of the electromagnetic shielding film pattern facing the transparent substrate is blackened, and a black conductive layer pattern which is formed above the electromagnetic shielding film pattern.

According to another aspect of the present invention, there is provided a plasma display panel (PDP) filter including the electromagnetic shielding film.

According to still another aspect of the present invention, there is provided a plasma display panel (PDP) device including the PDP filter.

According to yet another aspect of the present invention, there is provided a method of manufacturing an electromagnetic shielding film, the method including (a) forming a non-conductive layer on a conductive substrate, (b) forming a non-conductive layer pattern by patterning the non-conductive layer, (c) forming a black conductive layer pattern on the conductive substrate exposed by the non-conductive layer pattern, (d) forming an electromagnetic shielding film pattern on the black conductive layer pattern, (e) oxidizing the electromagnetic shielding film pattern to blacken the same, and (f) separating the black conductive layer pattern and the electromagnetic shielding film pattern from the conductive substrate using a transparent substrate on a face of which an adhesive is formed.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
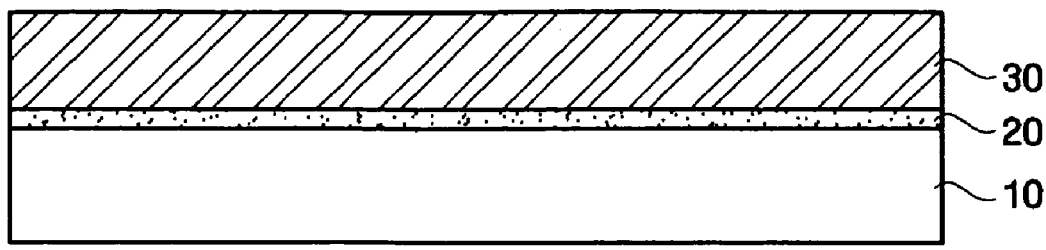
FIGS. 1A through 1C are sectional views of sequential processing steps for explaining a conventional method of manufacturing an electromagnetic shielding film.
Figure 1B:
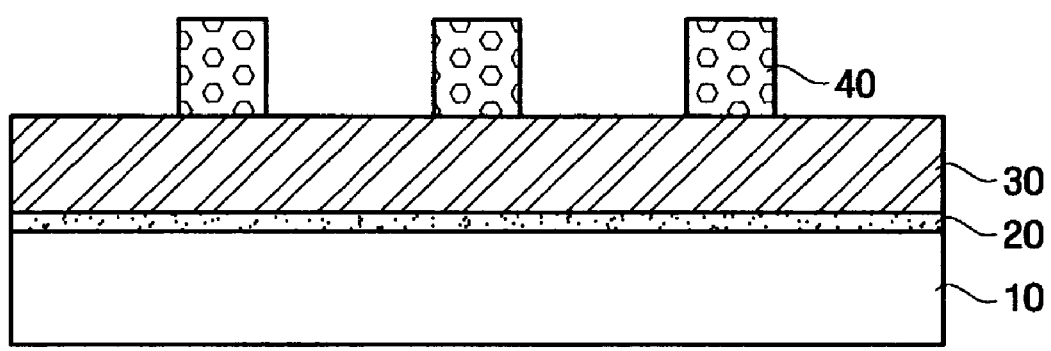
Figure 1C:
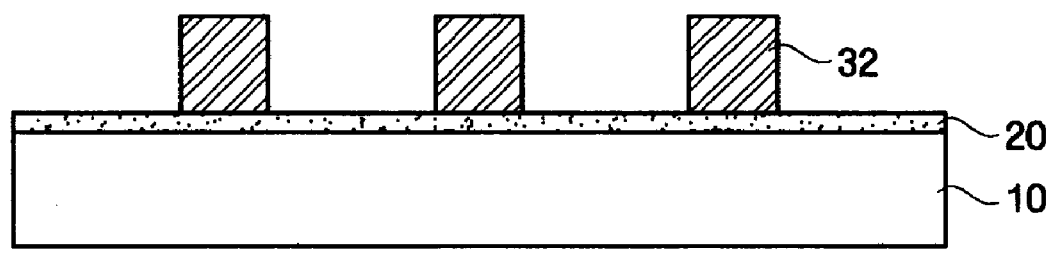

Advantages and features of the present invention and methods of accomplishing the same may be understood more readily by referring to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

Hereinafter, the present invention will be described with reference to FIGS. 2 through 11B.

Figure 2:
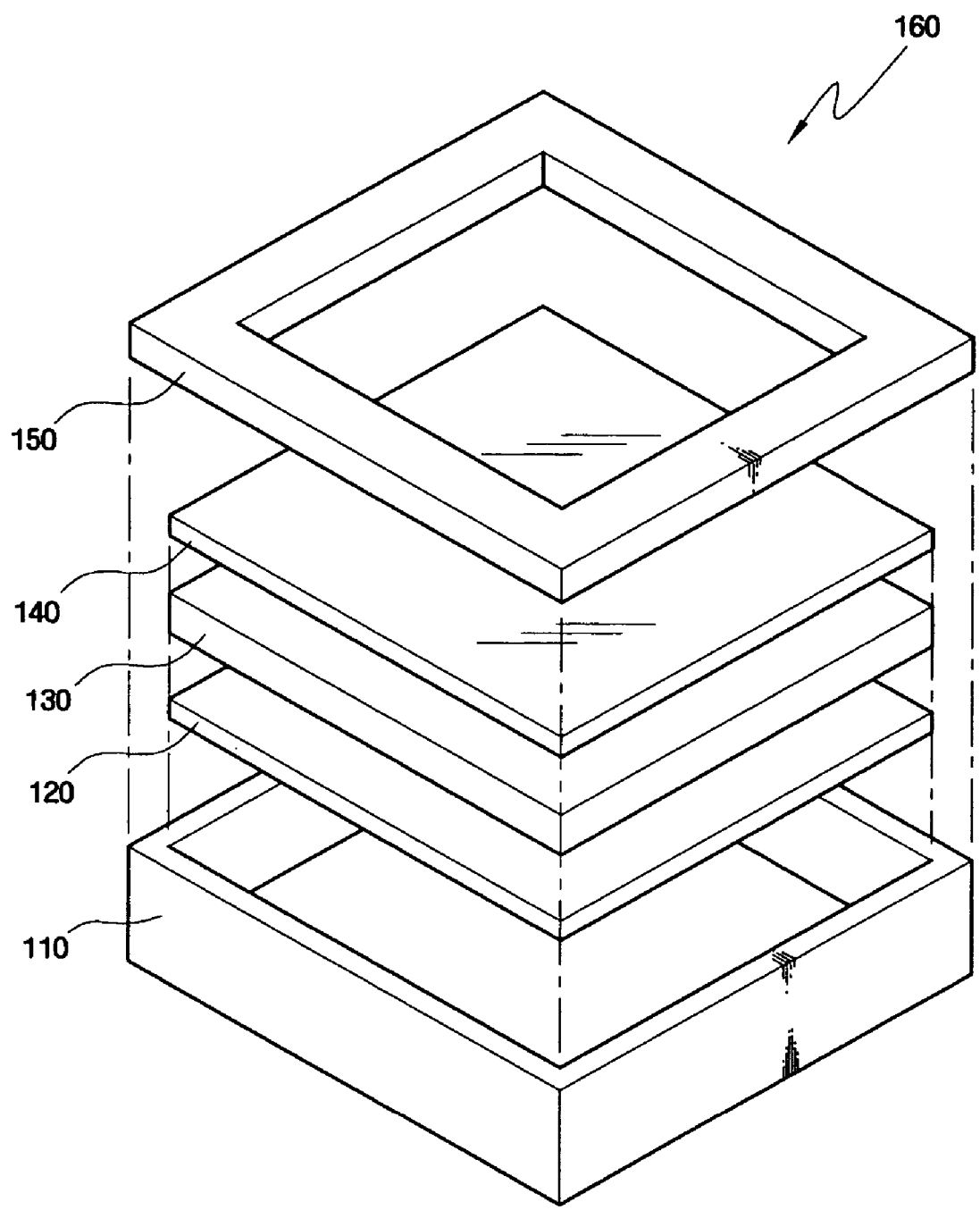
FIG. 2 is an exploded perspective view illustrating a plasma display panel (PDP) device according to an embodiment of the present invention.

FIG. 2 is an exploded perspective view illustrating a plasma display panel (PDP) device according to an embodiment of the present invention. Referring to FIG. 2, a PDP device 160 according to an embodiment of the present invention includes a case 110, a cover 150 covering an upper surface of the case 110, a driving circuit board 120 received in the case 110, a panel assembly 130 including discharge cells in which gas discharge occurs, and a PDP filter 140. The PDP filter 140 includes a conductive layer made of a material with good conductivity on a transparent substrate. The conductive layer is grounded to the case 110 via the cover 150. That is, an electromagnetic wave generated by the panel assembly 130 is grounded to the cover 150 and the case 110 through the conductive layer of the PDP filter 140 before reaching a viewer.

Hereinafter, a method of manufacturing an electromagnetic shielding film for shielding electromagnetic waves, used for the PDP filter 140, will be described.

FIGS. 3 through 11B are sectional views of sequential processing steps for explaining a method of manufacturing an electromagnetic shielding film according to an embodiment of the present invention.

Figure 3:
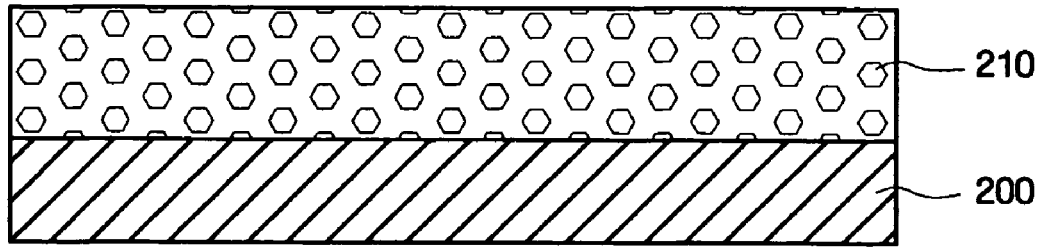
FIGS. 3 through 11B are sectional views of sequential processing steps for explaining a method of manufacturing an electromagnetic shielding film according to an embodiment of the present invention.

As shown in FIG. 3, a non-conductive layer 210 is formed on a conductive substrate 200.

The conductive substrate 200 serves as an electrode through which an electric current flows during a subsequent electroplating process. The conductive substrate 200 may be, for example, a stainless substrate (SUS 304 or SUS 430), a nickel substrate, or a copper substrate. The conductive substrate 200 may be in the form of a sheet or a hoop to ensure continuity in the manufacturing process of the PDP filter 140.

Since the conductive substrate 200 can serve as an electrode if an electric current flows through the conductive substrate 200, it may be formed thin. Thus, when the conductive substrate 200 has a thickness of 100 to 200 µm, a supplementary substrate (not shown) may be attached to a face of the conductive substrate 200 to reinforce the strength of the conductive substrate 200. Here, the conductive substrate 200 and the supplementary substrate may be bonded together using an adhesive having appropriate adhesion strength through lamination. In an embodiment of the present invention, the supplementary substrate may be a glass substrate or a polymer substrate that has appropriate thermal resistance and maintains the shape of the conductive substrate 200.

The conductive substrate 200 is alkali-washed. An alkali washing solution may be about 20% diluted KOH solution. Alkali washing is performed to remove organic material remaining on the conductive substrate 200. The conductive substrate 200 is then washed with water in a bath for about 1 to 2 minutes. The conductive substrate 200 is then acid-washed. An acid washing solution may be about 10% diluted sulfuric acid solution. After being washed with water in a bath, the conductive substrate 200 is dried with compressed air and is then naturally dried.

The non-conductive layer 210 is formed on the conductive substrate 200.

Here, the non-conductive layer 210 may be formed of an insulating material that prevents the conductive substrate 200 from being electroplated by interrupting an electric current flowing through the conductive substrate 200 during an electroplating process for forming an electromagnetic shielding film pattern (see FIGS. 5 through 8). It is preferable that a photoresist is used as the non-conductive layer 210 in consideration of adhesive strength between the non-conductive layer 210 and the conductive substrate 200 and convenience in patterning the non-conductive layer 210. The non-conductive layer 210 may be formed through electroless plating, sputtering, evaporation, spin coating, roll coating, a slit die technique or a slot die technique. In an embodiment of the present invention, when a photoresist is used as the non-conductive layer 210, it may be formed through spin coating, roll coating, or a slit die technique, and more preferably through roll coating or a slit die technique when taking into consideration the scaling up of a substrate. Here, the slit die technique involves uniformly applying a predetermined amount of solution to a substrate using a slit die which travels at a constant speed and which is held at a constant height above a conductive substrate.

The photoresist may be a positive or negative photoresist and the applied thickness of the photoresist may vary with the characteristics of the photoresist. After being formed, the photoresist is hardened by soft baking on a hot plate to remove a solvent element. The hardened photoresist is selectively exposed to ultraviolet (UV) light through a mask having a predetermined pattern and is thermally hardened by hard baking on a hot plate to distinguish between regions which have been UV irradiated and which have not been UV irradiated. The non-conductive layer 210 may have a final thickness of 15 µm or less, preferably 3 to 15 µm.

Figure 4A:
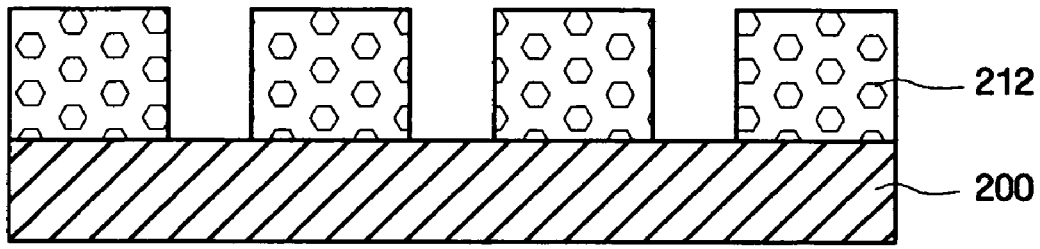

Referring to FIG. 4A, after being formed on the conductive substrate 200, the non-conductive layer 210 is patterned by a photolithographic process (exposure/development), thereby forming a non-conductive layer pattern 212.

Figure 4B:
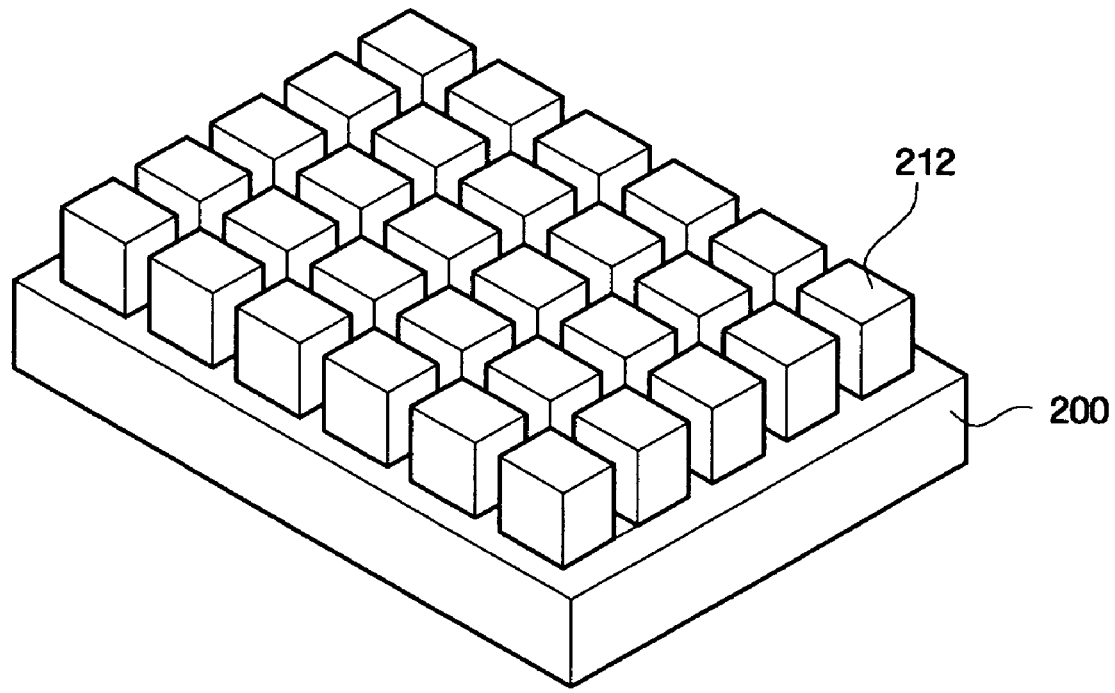

FIG. 4B is a perspective view illustrating the non-conductive layer pattern 212 according to an embodiment of the present invention. The non-conductive layer pattern 212 is shaped to form a mesh-type electromagnetic shielding film pattern. The non-conductive layer pattern 212 is used as a mold for forming an electromagnetic shielding film pattern during an electroplating process for forming an electromagnetic shielding film pattern (see FIGS. 5 through 8). Thus, the shape of the non-conductive layer pattern 212 may vary depending on the desired electromagnetic shielding film pattern, and may be, for example, a mesh-type pattern or a line-type pattern.

Figure 5:
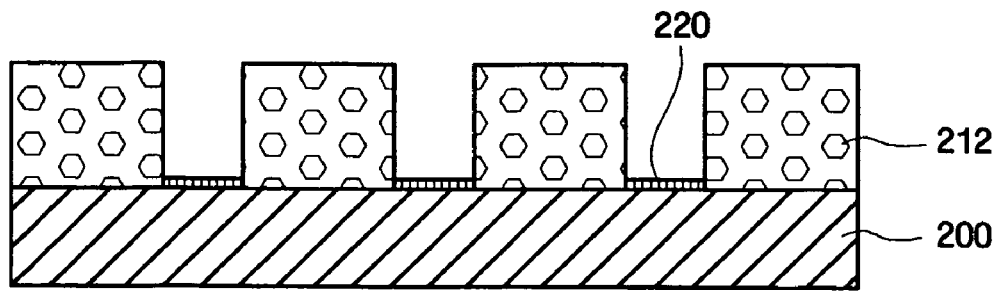

As shown in FIG. 5, a first seed layer 220 is formed on the conductive substrate 200 exposed by the non-conductive layer pattern 212. Here, the first seed layer 220 enhances adhesion strength between a black conductive layer pattern formed during a subsequent process and the conductive substrate 200 (see FIG. 6). The first seed layer 220 may be made of a metal such as nickel, chromium, iron, or copper, a metal oxide such as indium oxide, chromium oxide, tin oxide, silver oxide, cobalt oxide, mercury oxide, or iridium oxide, or a metal sulfide such as chromium sulfide, palladium sulfide, nickel sulfide, copper sulfide, cobalt sulfide, iron sulfide, tantalum sulfide, or titanium sulfide. In an embodiment of the present invention, the first seed layer 220 may be made of nickel in consideration of adhesion strength with a black conductive layer pattern to be formed and conductivity. The first seed layer 220 may be formed by electroplating using a plating solution including pure water, nickel chloride, and hydrochloric acid. The first seed layer 220 may be formed to a thickness of about 500 Å or less, and preferably to about 100 Å or less.

Figure 6:
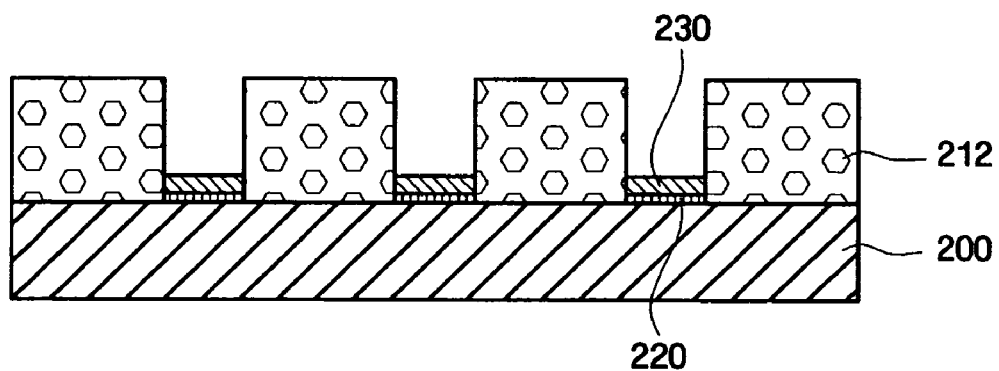

As shown in FIG. 6, a black conductive layer pattern 230 is formed on the first seed layer 220 between the non-conductive layer patterns 212. Here, the black conductive layer pattern 230 not only reduces the refractive index of an electromagnetic shielding film in the visible light region but it also functions as a shield of electromagnetic waves because it is made of a conductive material. The black conductive layer pattern 230 may be formed of metal such as nickel, cobalt, or chromium. In an embodiment of the present invention, it is preferable that the black conductive layer pattern 230 is made of black nickel because it is convenient to process, it blackens effectively, and it shields electromagnetic waves effectively.

The black conductive layer pattern 230 according to an embodiment of the present invention may be made of black nickel through electroplating. A plating solution may be a mixture of nickel sulfate, ammonium nickel sulfate, zinc sulfate, and sodium thiocyanate. In this case, it is preferable that the pH of the plating solution is maintained at between 5.6 and 5.9. Black nickel can be plated at a high temperature of about 50 to 55° C. as well as at a room temperature. Black nickel extracted from the plating solution may be a mixture of an alloy of nickel and zinc and nickel sulfide containing a large amount of sulfur.

Black nickel according to another embodiment of the present invention may be formed through electroless plating. An electroless plating solution may be a mixture of nickel chloride and Ni—P or Ni—B. In general, since the reaction velocity of electroplating is higher than that of electroless plating, it is desirable to form the black nickel through electroplating.

In an embodiment of the present invention, the first seed layer 220 can be used to electroplate the black conductive layer pattern 230 and can also improve adhesion strength between the conductive substrate 200 and the black conductive layer pattern 230. If a material of the conductive substrate 200 and a material of the black conductive layer pattern 230 have suitable adhesion strength with respect to each other through electroplating, the black conductive layer pattern 230 may be formed directly on the conductive substrate 200 without forming the first seed layer 220 on the conductive substrate 200. In an embodiment of the present invention, when the conductive substrate 200 is made of SUS 304 and the black conductive layer pattern 230 is made of black nickel, since SUS 304 and black nickel adhere weakly to each other, it is desirable to form the first seed layer 220 on the conductive substrate 200.

Figure 7:
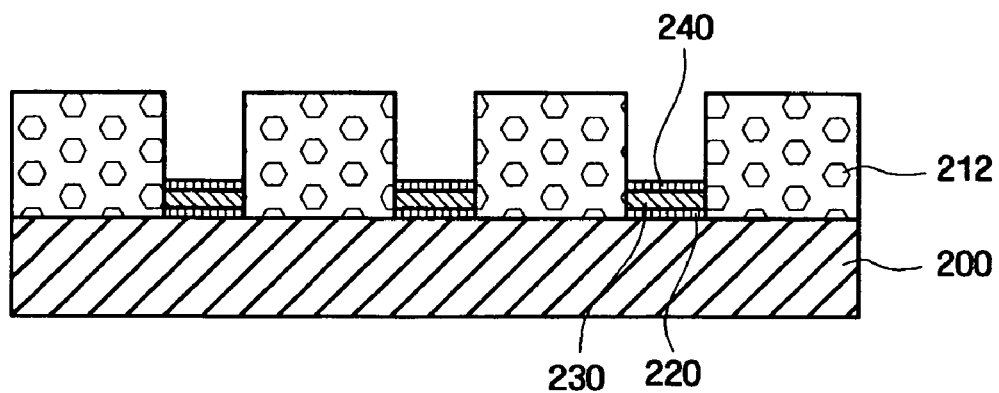

Thereafter, as shown in FIG. 7, a second seed layer 240 is formed on the black conductive layer pattern 230 between the non-conductive layer patterns 212. Here, the second seed layer 240 improves adhesion strength between an electromagnetic shielding film pattern to be formed during a subsequent process and the conductive substrate 200 or the black conductive layer pattern 230 (see FIG. 8). The second seed layer 240 may be formed of a metal such as nickel, chromium, iron, or copper, a metal oxide such as indium oxide, chromium oxide, tin oxide, silver oxide, cobalt oxide, mercury oxide, or iridium oxide, or a metal sulfide such as chromium sulfide, palladium sulfide, nickel sulfide, copper sulfide, cobalt sulfide, iron sulfide, tantalum sulfide, or titanium sulfide. In an embodiment of the present invention, the second seed layer 240 may be made of nickel in consideration of adhesion strength with an electroplating shielding film pattern to be formed and conductivity. The second seed layer 240 may be formed by electroplating using a plating solution including pure water, nickel chloride, and hydrochloric acid. The second seed layer 240 may be formed to a thickness of about 500 Å or less, and preferably to about 100 Å or less.

Figure 8:
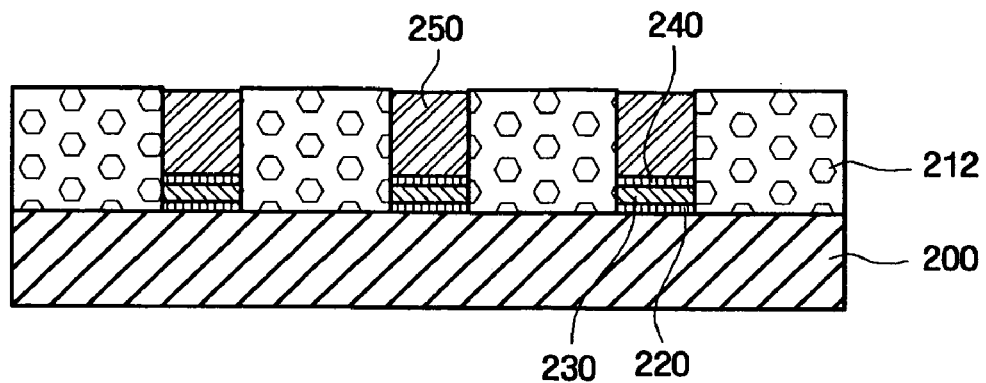

As shown in FIG. 8, an electromagnetic shielding film pattern 250 is formed through electroplating by allowing an electric current to flow on the conductive substrate 200. The electroplating shielding film pattern 250 may also be formed on the second seed layer 240 on the conductive substrate 200 between the non-conductive layer patterns 212. Thus, the electromagnetic shielding film pattern 250 having the same pattern as that of the non-conductive layer pattern 212 can be formed. Here, the electromagnetic shielding film pattern 250 may be made of a conductive material capable of shielding electromagnetic waves. For example, the electromagnetic shielding film pattern 250 may be made of a metal having superior electric conductivity and workability such as copper, chromium, nickel, silver, molybdenum, tungsten, aluminum, or iron. It is preferable to use copper or nickel in consideration of cost, electric conductivity, and workability. It is more preferable to use copper. For the uniform pattern of the electromagnetic shielding film pattern 250, it is preferable that the thickness of the electromagnetic shielding film pattern 250 is smaller than that of the non-conductive layer pattern 212 formed around the electromagnetic shielding film pattern 250. The thickness of the electromagnetic shielding film pattern 250 is preferably between 0.5 and 40 µm, and more preferably between 3 and 10 µm. If the thickness of the electromagnetic shielding film pattern 250 is less than 0.5 µm, an electromagnetic shielding capability may be reduced. On the other hand, if it exceeds 40 µm, the manufacturing time may increase. To entirely absorb an electromagnetic wave generated by the panel assembly 130, the conductive electromagnetic shielding film pattern 250 should have a thickness that is larger than a predetermined value. However, since visible light transmittance decreases as the thickness of the electromagnetic shielding film pattern 250 increases, it is preferable that the electromagnetic shielding film pattern 250 is formed to an appropriate thickness. In an embodiment of the present invention, when the electromagnetic shielding film pattern 250 is made of copper, a mixture of copper sulfate, sulfuric acid, and sodium chloride may be used as a plating solution.

In an embodiment of the present invention, the second seed layer 240 may not only be used to electroplate the electromagnetic shielding film pattern 250 but may also be used to improve adhesion strength between the black conductive layer pattern 230 and the electromagnetic shielding film pattern 250. Thus, if a material of the black conductive layer pattern 230 and a material of the electromagnetic shielding film pattern 250 have a suitable adhesion strength with respect to each other through electroplating, the electromagnetic shielding film pattern 250 may be formed directly on the black conductive layer pattern 230 without forming the second seed layer 240 on the black conductive layer pattern 230. In an embodiment of the present invention, when the black conductive layer pattern 230 is made of black nickel and the electromagnetic shielding film pattern 250 is made of copper, since black nickel and copper adhere weakly to each other, it is desirable to form the second seed layer 240 on the black conductive layer pattern 230.

Figure 9:
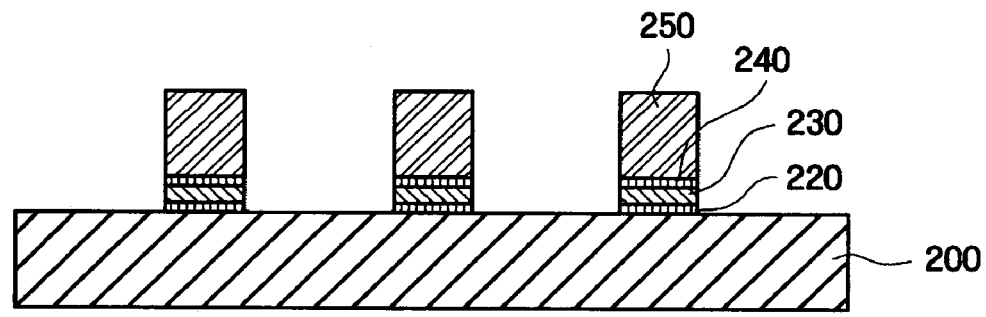

Thereafter, a resultant structure on the conductive substrate 200 is sufficiently washed with pure water to entirely remove the plating solution remaining on the conductive substrate 200. As shown in FIG. 9, the non-conductive layer pattern 212 is removed. The non-conductive layer pattern 212 may be removed by wet or dry etching, preferably with an etching technique having high selectivity with respect to the non-conductive layer pattern 212 and the electromagnetic shielding film pattern 250. In an embodiment of the present invention, when a photoresist is used as the non-conductive layer pattern 212 and a conductive material is used as the electromagnetic shielding film pattern 250, the non-conductive layer pattern 212 may be removed through a typical photoresist strip process.

After completion of the processes shown in FIGS. 3 through 9, the first seed layer 220, the black conductive layer pattern 230, the second seed layer 240, and the electromagnetic shielding film pattern 250 are sequentially formed on the conductive substrate 200. It is preferable that the electromagnetic shielding film pattern 250 formed on the conductive substrate 200 is blackened. Blackening prevents surface reflection off the electromagnetic shielding film pattern 250. As such, three faces of the electromagnetic shielding film pattern 250, including side walls, are blackened, and in addition a face of the electromagnetic shielding film pattern 250 facing the conductive substrate 200 is also blackened, since the black conductive layer pattern 230 is positioned on the face of the electromagnetic shielding film pattern 250 opposite to the conductive substrate 200. Therefore, four faces of the electromagnetic shielding film pattern 250 are blackened. In the above description, the electromagnetic shielding film pattern 250 is blackened after the non-conductive layer pattern 212 is removed from the conductive substrate 200. However, blackening according to the present invention is not limited to the above-described blackening method. Thus, the non-conductive layer pattern 212 may be removed from the conductive substrate 200 after the electromagnetic shielding film pattern 250 is blackened. In this case, side walls of the electromagnetic shielding film pattern 250 are not blackened, but two faces of the electromagnetic shielding film pattern 250 facing the user's side and the panel assembly's side are blackened. The aim of the present invention is to form an electromagnetic shielding film having low refractive index in the visible light region. To this end, it is necessary to blacken faces of an electromagnetic shielding film facing the user's side and the panel assembly's side. In embodiments of the present invention, both blackening of four faces and blackening of two faces are suitable for achieving the object of the present invention.

For convenient explanation, a description will be made regarding a case where the electromagnetic shielding film pattern 250 includes copper. Blackening may vary with a material of the electromagnetic shielding film pattern 250. In an embodiment of the present invention, blackening involves oxidizing the surface of copper to $Cu_2O$ or $CuO$. The purpose of blackening can be roughly divided into two sub-goals. One is to provide an oxide layer on a surface of the electromagnetic shielding film pattern 250 making it inactive. The surface of copper readily reacts with the atmosphere and other elements at high temperature and resulting in corrosion, formation of water, or formation of a weak boundary layer, thus reducing adhesion strength. At this time, the electromagnetic shielding film pattern 250 is delaminated due to water on the boundary layer. For this reason, the oxide layer is formed by blackening, preventing formation of water or corrosion. The other goal is to reduce the refractive index of copper in the visible light region. Since copper has a refractive index of 60% or more in the visible light region, glare may occur or brightness may be reduced from the viewpoint of a viewer due to reflection from an external light source. Thus, to prevent external light from being reflected and allow the external light to be absorbed, the electromagnetic shielding film pattern 250 is blackened. A blackening solution according to an embodiment of the present invention is an undiluted solution of Cu Black No. 444™ (available from SurChem Research Ltd., changed the company name from Juam Plating Chemicals, Korea).

Figure 10:
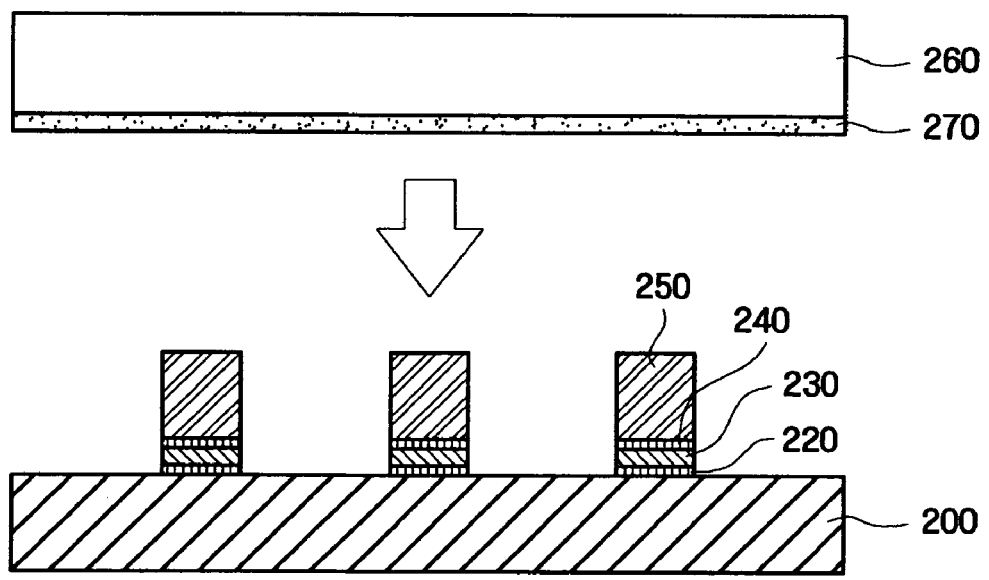

As shown in FIG. 10, a transparent substrate 260 is prepared to separate the electromagnetic shielding film pattern 250 and the black conductive layer pattern 230 from the conductive substrate 200.

An adhesive 270 is formed on a face of the transparent substrate 260, and the electromagnetic shielding film pattern 250 and the black conductive layer pattern 230 are separated from the conductive substrate 200 using the transparent substrate 260 on which the adhesive 270 is formed. Thus, the electromagnetic shielding film pattern 250 formed on the conductive substrate 200 is transferred and attached to the transparent substrate 260. Since adhesion strength between the electromagnetic shielding film pattern 250 formed on the conductive substrate 200 by electroplating and the conductive substrate 200 is generally smaller than that between the electromagnetic shielding film pattern 250 and the adhesive 270 formed on the transparent substrate 260, the electromagnetic shielding film pattern 250 and the black conductive layer pattern 230 can be easily separated from the conductive substrate 200.

Here, the transparent substrate 260 is formed of a tempered glass or a semi-tempered glass or a transparent plastic material such as acryl having a thickness of 100 to 200 μm. It is difficult to make a lightweight filter out of glass, which has a specific gravity of 2.6, and glass increases the entire weight of a PDP set in mounting of the PDP set due to its large thickness, but plays an important role in improving scattering characteristic.

In an embodiment of the present invention, the transparent substrate 260 may be an inorganic compound material such as glass or quartz or a transparent organic polymer material. Since an organic polymer material is light and is not easily broken, it is desirable to use an organic polymer material.

Acryl or polycarbonate is generally used as the transparent substrate 260, but the present invention is not limited thereto. It is preferable that the transparent substrate 260 has high transparency and thermal resistance, and a polymer material and a stacked structure of a polymer material may be used for the transparent substrate 260. It is preferable that the transparent substrate 260 transmits 80% or more of visible light and has a thermal resistance of a glass transition temperature of 60° C. or more. It is preferable that the polymer material is transparent in the visible light region. Examples of the transparent polymer material include, but are not limited to, polyethyleneterephthalate (PET), polysulfone (PS), polyethersulfone (PES), polystyrene, polyethylenenaphthalate, polyacrylate, polyetheretherketone (PEEK), polycarbonate (PC), polypropylene (PP), polyimide, triacetylcellulose (TAC), and polymethylmethacrylate (PMMA). It is preferable to use PET because it has a suitable cost, thermal resistance, and transparency.

Figure 11A:
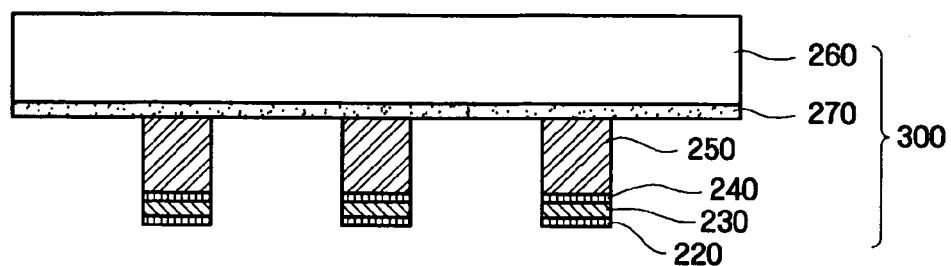
Figure 11B:
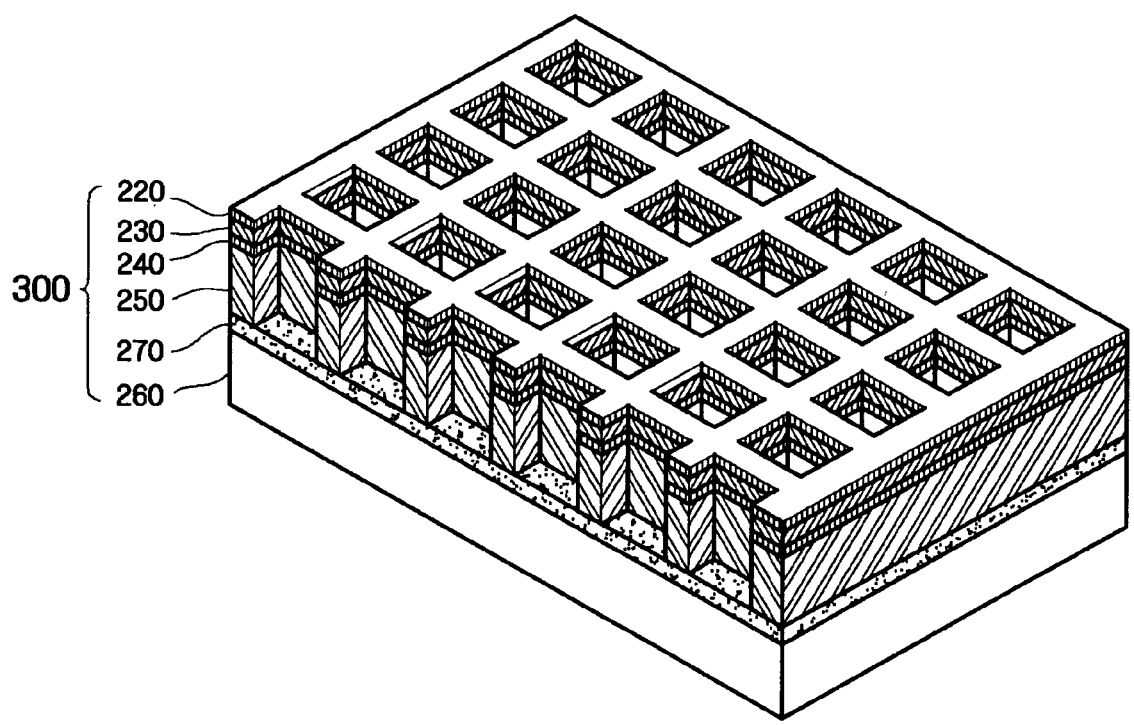

As shown in FIG. 11A, an electromagnetic shielding film 300 having the blackened electromagnetic shielding film pattern 250 and the black conductive layer pattern 230 on the transparent substrate 260 is finally formed. The electromagnetic shielding film 300 has a structure in which the transparent substrate 260, the adhesive 270 formed on a face of the transparent substrate 260, the blackened electromagnetic shielding film pattern 250, the second seed layer 240, the black conductive layer pattern 230, and the first seed layer 220 are sequentially stacked. Here, since the first seed layer 220 located outermost is formed very thin, preferably to a thickness of about 100 Å or less, it can be removed from the electromagnetic shielding film 300 during a subsequent washing process. Thus, the first seed layer 220 can be partially or entirely removed from the final structure of the electromagnetic shielding film 300. FIG. 11B is a perspective view illustrating the electromagnetic shielding film 300.

The PDP filter 140 is completed by combining the electromagnetic shielding film 300 with a color correction layer, a near-infrared shielding layer, and an antireflective layer.

Here, the PDP filter 140 has a structure in which the electromagnetic shielding film 300, the color correction layer, the near-infrared shielding layer, and the antireflective layer are stacked in a random order. In the following description of an embodiment of the present invention, layers that perform a neon-light shielding function, a near-infrared shielding function, and an antireflective function are separated, but the present invention is not limited thereto and the PDP filter 140 may be formed of at least one layer integrating such functions.

The PDP filter 140 according to an embodiment of the present invention is composed of the electromagnetic shielding film 300 in which the electroplating shielding film pattern 250 is formed on one face of the transparent substrate 260, and the color correction layer, the near-infrared shielding layer, and the anti-reflective layer are formed on the other face of the transparent substrate 260.

In general, a red visible light emitted from plasma in the panel assembly 130 appears as an orange light. The color correction layer performs a color correction, changing the color from orange to red. It is more preferable that visible light emitted from plasma in the panel assembly 130 passes through the color correction layer and then the near-infrared shielding layer rather than through the near-infrared shielding layer and then the color correction layer. Thus, it is more efficient to arrange the color correction layer to be closer to the panel assembly 130. In an embodiment of the present invention, the color correction layer and the near-infrared layer are separately formed. However, a hybrid film having both a near-infrared shielding function and a color correction function may also be used.

The color correction layer uses a colorant with selective absorptivity capable of absorbing emitted orange light in the range from 580 to 600 nm to increase a color reproduction range of a display and to improve screen sharpness. The colorant may be a dye or a pigment. The colorant may be an organic colorant having a neon light-shielding function such as anthraquinones, cyanines, azos, stilbenes, phthalocyanines, and methines, but the present invention is not limited thereto. The type and concentration of the colorant are not particularly defined herein since they are determined by an absorption wavelength, an absorption coefficient, and transmission characteristics required for a display.

The near-infrared shielding layer shields strong near-infrared radiation from the panel assembly 130 that may cause a malfunction of electronic devices such as wireless telephones and remote controllers. The near-infrared shielding layer may use polymer resin containing a near-infrared absorbing colorant that absorbs the wavelength in a near-infrared region to shield near-infrared rays emitted by the panel assembly 130. For example, the near-infrared absorbing colorant may be an organic colorant such as cyanines, anthraquinones, naphtoquinones, phthalocyanines, naphtalocyanines, dimonuims, and nickeldithiol. Since the PDP device 160 emits strong near infrared rays over a broad wavelength range, a near-infrared shielding layer capable of absorbing near-infrared rays over a broad wavelength range should be used.

The antireflective layer according to an embodiment of the present invention is formed on the near-infrared shielding layer and the color correction layer, but the present invention is not limited thereto. It is preferable that the antireflective layer is formed such that it is positioned to face the viewer, that is, at an opposite side to the panel assembly 130, when the PDP filter 140 is mounted in the PDP device 160. The antireflective layer may enhance visibility by reducing the reflection of external light.

The antireflective layer may also be further formed at the side of the panel assembly 130 of the PDP filter 140, thereby further efficiently reducing the reflection of external light. The reduction of the reflection of external light by the antireflective layer can further enhance the transmittance of visible light emitted by the panel assembly 130. The antireflective layer may also be formed on a substrate by coating or printing using an antireflective film or by a variety of generally known film formation methods. Alternatively, the antireflective layer may be formed by attaching an arbitrary transparent mold having an antireflective film or an antireflective transparent structure to a desired site using a transparent adhesive or bond.

Concretely, the antireflective layer may be a ¼ wavelength mono-layered film made of a material having a low refractive index in the visible light region of 1.5 or less, and preferably of 1.4 or less such as a fluorine-based transparent polymer resin, magnesium fluoride, a silicon-based resin, or silicon oxide. The antireflective layer may also be a multi-layered film made of two or more materials with different refractive indices selected from an inorganic compound such as metal oxide, fluoride, silicide, boride, carbide, nitride, and sulfide, and an organic compound such as silicon-based resin, acrylic resin, and fluorine-based resin.

Here, the antireflective layer formed as a mono-layered film is easy to manufacture but exhibits a poorer antireflection effect than an antireflective layer formed as a multi-layered film. The antireflective layer formed as a multi-layered film exhibits an antireflection effect over a broad wavelength range. The inorganic compound may be formed by generally known methods such as sputtering, ion-plating, ion-beam assist, vacuum deposition, and wet coating and the organic compound may be formed by generally known methods such as wet coating.

For example, the antireflective layer may be an alternately stacked structure having a low refractive index oxide film made of, for example, $SiO_2$ and a high refractive index oxide film made of, for example, $TiO_2$ or $Nb_2O_5$. The low refractive index oxide film and the high refractive index oxide film may be formed by sputtering or wet coating.

In an embodiment of the present invention, a layer or film is attached to another by a transparent adhesive or bond, for example, an acrylic adhesive, a silicon-based adhesive, a urethane-based adhesive, a polyvinylbutyral adhesive (PMB), an ethylene-vinylacetate adhesive (EVA), polyvinylether, saturated amorphous polyester, or melamin resin.

According to the present invention, in an electromagnetic shielding film having a high refractive index in the visible light region, not only is a portion facing a user's side blackened but also a portion facing a panel assembly is blackened, thereby improving brightness and image quality. In other words, a neighboring area of an electromagnetic shielding film pattern constituting an electromagnetic shielding film is blackened, thereby improving brightness performance of a PDP device through an electromagnetic shielding film that has either two or four faces blackened.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. An electromagnetic shielding film, comprising:
   a transparent substrate;
   an electromagnetic shielding film pattern formed above the transparent substrate, wherein a face of the electromagnetic shielding film pattern facing the transparent substrate is blackened;
   a black conductive layer pattern formed above the electromagnetic shielding film pattern;
   a first seed layer formed on one side of the black conductive layer pattern; and
   a second seed layer formed on the other side of the black conductive layer pattern and is on the electromagnetic shielding film pattern.

2. The electromagnetic shielding film of claim 1, wherein the black conductive layer pattern includes black nickel.

3. The electromagnetic shielding film of claim 1, wherein the electromagnetic shielding film pattern includes copper.

4. The electromagnetic shielding film of claim 1, wherein the first seed layer and the second seed layer are made of nickel.

5. The electromagnetic shielding film of claim 1, wherein in the electromagnetic shielding film pattern, sidewalls are blackened.

6. A plasma display panel (PDP) filter including the electromagnetic shielding film of claim 1.

7. A plasma display panel (PDP) device including the PDP filter of claim 6.

* * * * *

UNITED STATES PATENT AND TRADEMARK OFFICE
CERTIFICATE OF CORRECTION

| | | |
|---|---|---|
| PATENT NO. | : 7,655,873 B2 | Page 1 of 1 |
| APPLICATION NO. | : 11/213082 | |
| DATED | : February 2, 2010 | |
| INVENTOR(S) | : Yong-won Choi | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1078 days.

Signed and Sealed this

Thirtieth Day of November, 2010

David J. Kappos
*Director of the United States Patent and Trademark Office*